(12) United States Patent
Cai et al.

(10) Patent No.: US 8,420,469 B2
(45) Date of Patent: Apr. 16, 2013

(54) SCHOTTKY FET FABRICATED WITH GATE LAST PROCESS

(75) Inventors: Jin Cai, Cortlandt Manor, NY (US); Dechao Guo, Wappingers Falls, NY (US); Marwan H. Khater, Astoria, NY (US); Christian Lavoie, Pleasantville, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 12/834,428

(22) Filed: Jul. 12, 2010

(65) Prior Publication Data

US 2012/0007181 A1 Jan. 12, 2012

(51) Int. Cl.
*H01L 21/338* (2006.01)

(52) U.S. Cl.
USPC ............ 438/183; 257/E21.444; 257/E21.453; 438/259

(58) Field of Classification Search ............. 257/330, 257/332, 347, E21.429, E21.444, E21.453, 257/E21.621; 438/183, 300, 303, 259, 589
See application file for complete search history.

(56) References Cited

U.S. PATENT DOCUMENTS 6,660,598 B2 * 12/2003 Hanafi et al. ................. 438/291
7,605,424 B2 * 10/2009 Imoto et al. ................... 257/330
7,767,535 B2 *  8/2010 Matsuo ......................... 438/306

OTHER PUBLICATIONS

Khater et al., High-K/Metal-Gate Fully Depleted SOI CMOS With Single-Silicide Schottky Source/Drain With Sub-30-nm Gate Length, IEEE Electron Device Letters, Apr. 2010, pp. 275-277, vol. 31, No. 4, IEEE.

Zhang et al., Schottky-Barrier Height Tuning by Means of Ion Implantation Into Preformed Silicide Films Followed by Drive-In Anneal, IEEE Electron Device Letters, Jul. 2007, pp. 565-568, vol. 28, No. 7, IEEE.

Zhang et al., Sharp Reduction of Contact Resistivities by Effective Schottky Barrier Lowering With Silicides as Diffusion Sources, IEEE Electron Device Letters, Jul. 2010, pp. 731-733, vol. 31, No. 7, IEEE.

* cited by examiner

*Primary Examiner* — David Vu

(74) *Attorney, Agent, or Firm* — Cantor Colburn LLP; Louis Percello

(57) ABSTRACT

A method for forming a field effect transistor (FET) includes forming a dummy gate on a top semiconductor layer of a semiconductor on insulator substrate; forming source and drain regions in the top semiconductor layer, wherein the source and drain regions are located in the top semiconductor layer on either side of the dummy gate; forming a supporting material over the source and drain regions adjacent to the dummy gate; removing the dummy gate to form a gate opening, wherein a channel region of the top semiconductor layer is exposed through the gate opening; thinning the channel region of the top semiconductor layer through the gate opening; and forming gate spacers and a gate in the gate opening over the thinned channel region.

15 Claims, 7 Drawing Sheets

SCHOTTKY FET FABRICATED WITH GATE LAST PROCESS

FIELD

This disclosure relates generally to the field of field effect transistor fabrication.

DESCRIPTION OF RELATED ART

In order to be able to make integrated circuits (ICs), such as memory, logic, and other devices, of a higher integration density than is currently feasible, field effect transistor (FET) dimensions must be scaled down, as FETs are an important component of many ICs. A Schottky junction source/drain complementary metal-oxide-semiconductor (CMOS) field effect transistor (FET) is a viable option for thin-body devices and sub-30 nanometer (nm) gate CMOS technology. Schottky FETs may have relatively low parasitic resistance and gate-to-drain parasitic capacitance, due to the lack of raised source/drain regions, as well as abrupt source/drain junctions. In particular, to fabricate a sub-15 nm FET in silicon-on-insulator (SOI) with good electrostatics and control of the channel region, the semiconductor material in the channel region may need to be very thin, about 7 nm or less. However, achieving a precise thickness at such small dimensions may be difficult; the variation in the thickness of the semiconductor material may be about 2 nm up or down.

The silicon (Si) thickness available for the silicide in source and drain regions may be even less, and with greater variation, because of the Si loss during spacer reactive ion etching (RIE) and pre-silicide cleaning. Insufficient Si thickness raises silicide encroachment and delemination problems during the fully silicided source/drain process, since the metal amount needed is determined by Si thickness in the source/drain. The source and drain semiconductor material may be built up to avoid these issues using epitaxial growth; however, it is difficult to grow an epitaxial layer on a semiconductor layer that is about 5 nm thick or less.

SUMMARY

In one aspect, a method for forming a field effect transistor (FET) includes forming a dummy gate on a top semiconductor layer of a semiconductor on insulator substrate; forming source and drain regions in the top semiconductor layer, wherein the source and drain regions are located in the top semiconductor layer on either side of the dummy gate; forming a supporting material over the source and drain regions adjacent to the dummy gate; removing the dummy gate to form a gate opening, wherein a channel region of the top semiconductor layer is exposed through the gate opening; thinning the channel region of the top semiconductor layer through the gate opening; and forming gate spacers and a gate in the gate opening over the thinned channel region.

In one aspect, a field effect transistor (FET) includes a semiconductor on insulator substrate, the substrate comprising a top semiconductor layer; source and drain regions located in the top semiconductor layer; a channel region located in the top semiconductor layer between the source region and the drain region, the channel region having a thickness that is less than a thickness of the source and drain regions; a gate located over the channel region; and a supporting material located over the source and drain regions adjacent to the gate.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several Figures.

DETAILED DESCRIPTION

Embodiments of a Schottky source/drain FET with a thinned channel region, and a method of making a Schottky source/drain FET with a gate last process, are provided, with exemplary embodiments being discussed below in detail. The semiconductor material in which the source, drain, and channel are formed may be relatively thick (in the range from about 10 nm to about 20 nm thick in some embodiments), allowing for relatively easy formation of source and drain silicide regions. The portion of the semiconductor material located in the channel region may be thinned to an appropriate channel thickness using a process that allows precise thickness control, such as a sequential ozone modified Huang cleaning. The finished channel region of the FET may be from about 0 nm to about 7 nm thick in some embodiments.

Figure 1:
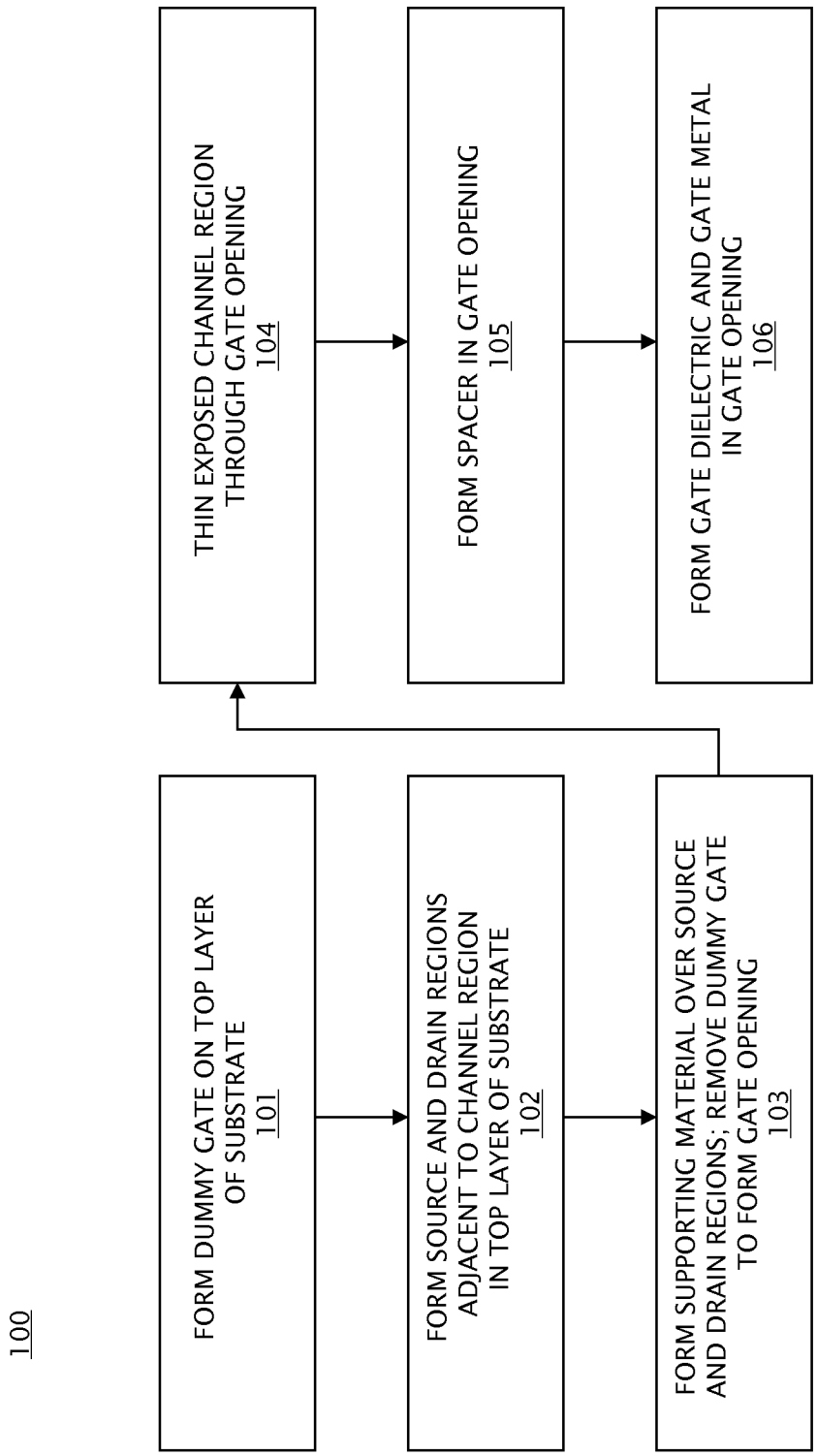
FIG. 1 illustrates an embodiment of a method of fabricate a Schottky source/drain FET with a gate last process.
Figure 2:
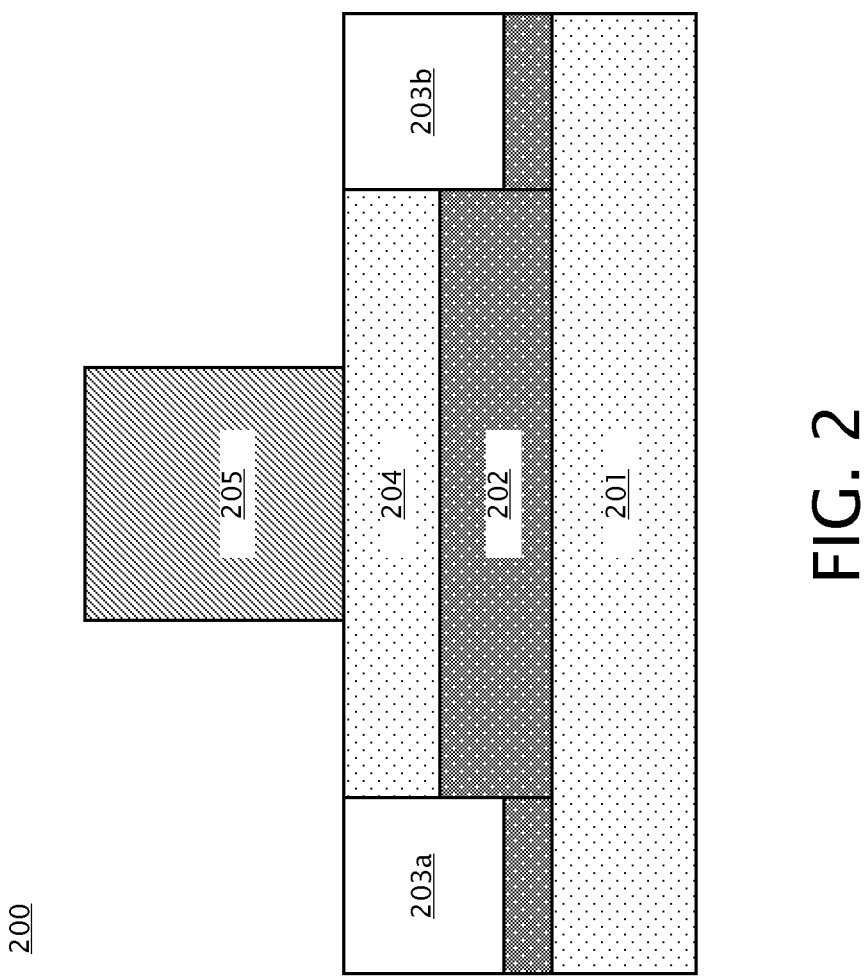
FIG. 2 illustrates an embodiment of a dummy gate formed on a substrate.

FIG. 1 illustrates an embodiment of a method 100 of making a FET with a thinned channel region. FIG. 1 is discussed with reference to FIGS. 2-7. Method 100 is a gate last FET fabrication process. In block 101, a dummy gate 205 is formed on a top semiconductor layer 204 of a semiconductor on insulator substrate. The semiconductor on insulator substrate includes bottom semiconductor layer 201, buried insulator layer 202, and top semiconductor layer 204. Bottom semiconductor layer 201 and top semiconductor layer 204 may include silicon (Si) in some embodiments, and buried insulator layer 202 may include buried oxide (BOX) in some embodiments. Shallow trench isolation (STI) regions 203a-b are also formed in the substrate in buried insulator layer 202 and top semiconductor layer 204. STI regions 203a-b prevent electrical leakage between various FET devices located on the substrate, and may include a dielectric material in some embodiments. Dummy gate 205 may be made from a nitride material or silicon germanium (SiGe) in some embodiments. Top semiconductor layer 204 may be from about 10 nanometers to about 20 nanometers thick in some embodiments.

Figure 3:
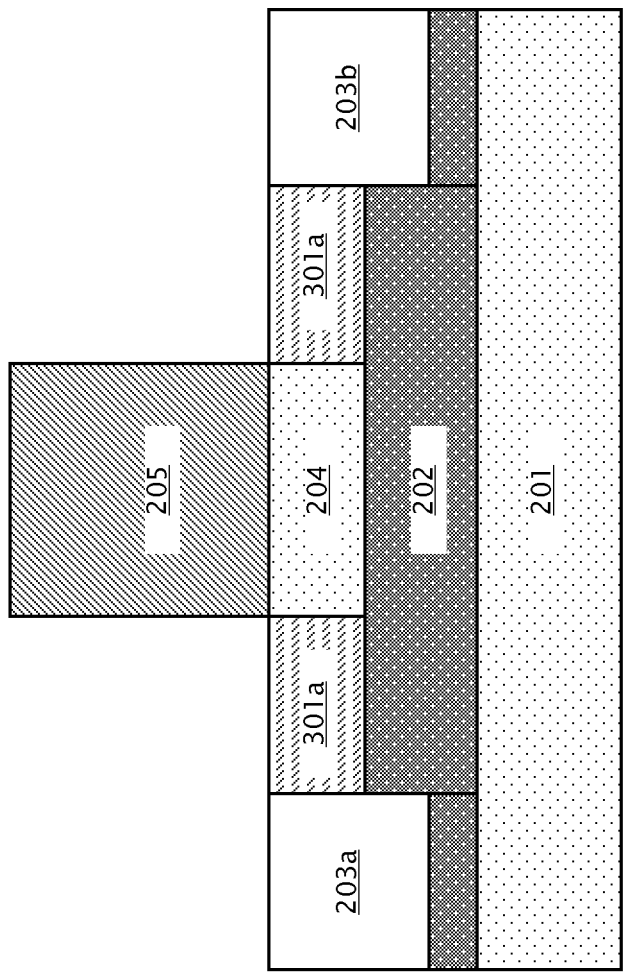
FIG. 3 illustrates an embodiment of the device of FIG. 2 after formation of source and drain regions.

In block 102, silicide source and drain regions 301a-b are formed in top semiconductor layer 204, as shown in FIG. 3. Source and drain regions 301a-b may be from about 10 nm to about 20 nm thick in some embodiments. In embodiments in which source and drain regions 301a-b are silicide, the silicide may be formed using a self-aligned silicide process. In a self-aligned silicide process, first, a metal layer is formed over the portion of top semiconductor layer 204 in which the source and drain regions 301a-b are to be formed, on either side of dummy gate 205. The metal layer may be nickel (Ni), nickel platinum (NiPt), platinum (Pt), cobalt (Co), or titanium (Ti) in some embodiments, and may be formed by plating or sputtering in some embodiments. The top semiconductor layer 204 and metal layer are then rapid thermal annealed (RTA) to cause the metal layer to react with a portion of top semiconductor layer 204 to form silicide in the source and drain regions 301a-b, and any unreacted portion of the metal layer is then removed, resulting in the device 300 shown in FIG. 3. The unreacted portion of the metal layer may be removed by etching. The silicide may be a nickel silicide, nickel platinum silicide, platinum silicide, cobalt silicide, or titanium silicide in some embodiments. Workfunction tuning of the source and drain regions 301a-b may also be performed in some embodiments. Workfunction tuning may include formation of segregated interfacial dopant layers (not shown) between the silicide that comprises source and drain regions 301a-b and top semiconductor layer 204. The segregated interfacial dopant layers may be formed by any appropriate process, including but not limited to implantation of source and drain regions 301a-b with dopants and annealing to drive the dopants to the interfaces between source and drain regions 301a-b and top semiconductor layer 204, forming the segregated interfacial dopant layers.

Figure 4:
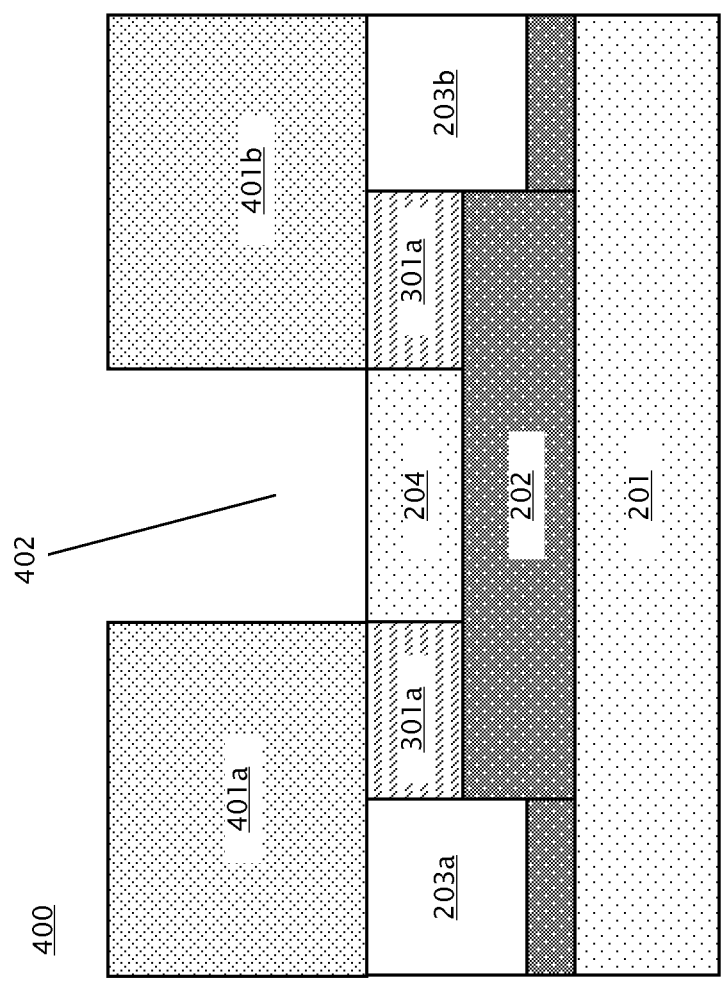
FIG. 4 illustrates an embodiment of the device of FIG. 3 after formation of supporting material and removal of the dummy gate to form a gate opening.

In block 103, a supporting material 401a-b is formed over source and drain regions 301a-b and around dummy gate 205. Dummy gate 205 is then selectively removed, resulting in device 400 as shown in FIG. 4. Supporting material 401a-b may be any material that allows selective removal of dummy gate 205 without removal of supporting material 401a-b and top semiconductor layer 204. Supporting material 401a-b may include oxide in some embodiments. Supporting material 401 may be formed by depositing the supporting material over the device 300 of FIG. 3, and performing chemical mechanical polishing (CMP) to expose the top of dummy gate 205. After the top of dummy gate 205 is exposed by the CMP, dummy gate 205 is selectively removed, resulting in gate opening 402. Removal of dummy gate 205 exposes top semiconductor layer 204 through gate opening 402.

Figure 5:
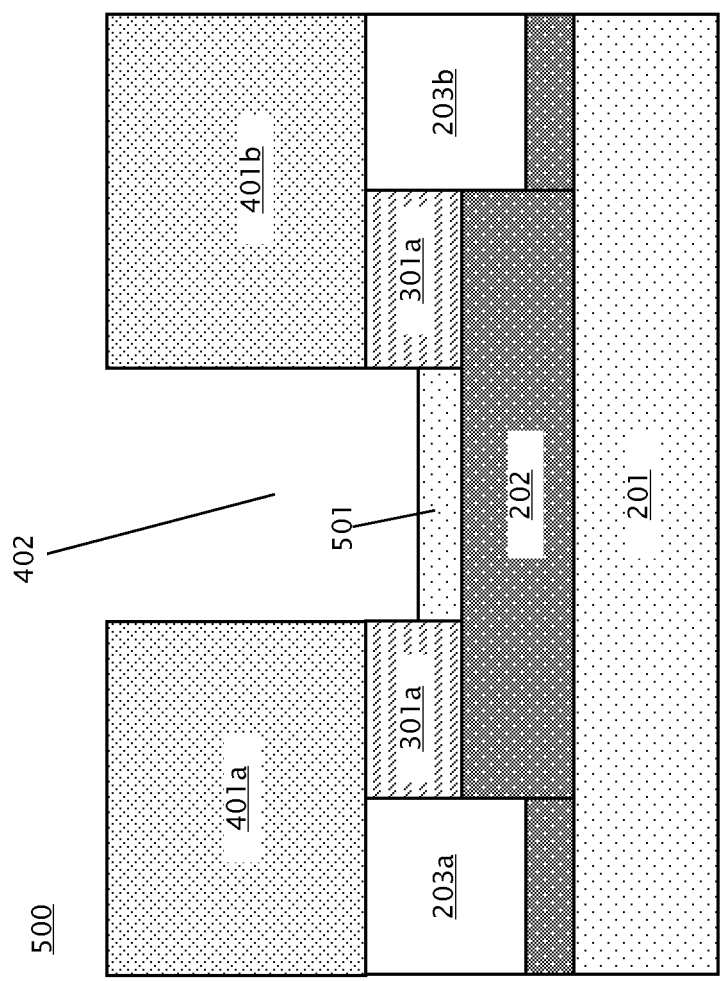
FIG. 5 illustrates an embodiment of the device of FIG. 4 after thinning of the channel region through the gate opening.
Figure 6:
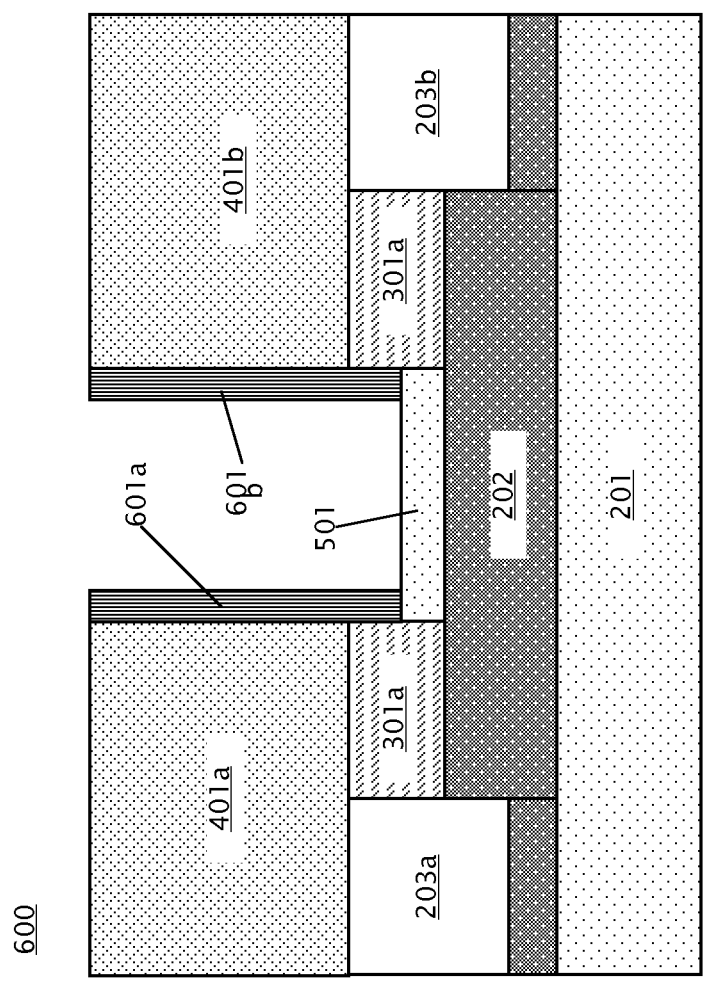
FIG. 6 illustrates an embodiment of the device of FIG. 5 after formation of a spacer in the gate opening.

In block 104, top semiconductor layer 204 is thinned through gate opening 402, resulting thinned channel region 501 as shown in FIG. 5. Thinned channel region 501 may be formed using a sequential Ozone modified Huang cleaning process in some embodiments. In a sequential Huang cleaning process, a surface of the material to be thinned is oxidized using ozone ($O_3$), and the oxidized portion of the material is then removed using diluted hydrofluoric acid (HF). The oxidation and removal steps may be repeated as many times as necessary to achieve the desired thickness of thinned channel region 501. The sequential ozone modified Huang cleaning process allows precise control of the final thickness of the thinned material. Thinned channel region 501 may be from about 0 nm thick to about 7 nm thick in some embodiments.

In block 105, a spacer 601a-b is formed on supporting material 401a-b and source/drain regions 301a-b inside the gate opening 402. Spacer 601a-b may be nitride in some embodiments. Spacer 601a-b may be formed by deposition of the spacer material on the interior of gate opening 402, and then etching the spacer material to form spacer 601a-b having desired dimensions. Any spacer material that that forms on the surface of thinned channel region 501 during deposition may also be removed by directional etching. The etching may include a dry etch such as reactive ion etching in some embodiments.

Figure 7:
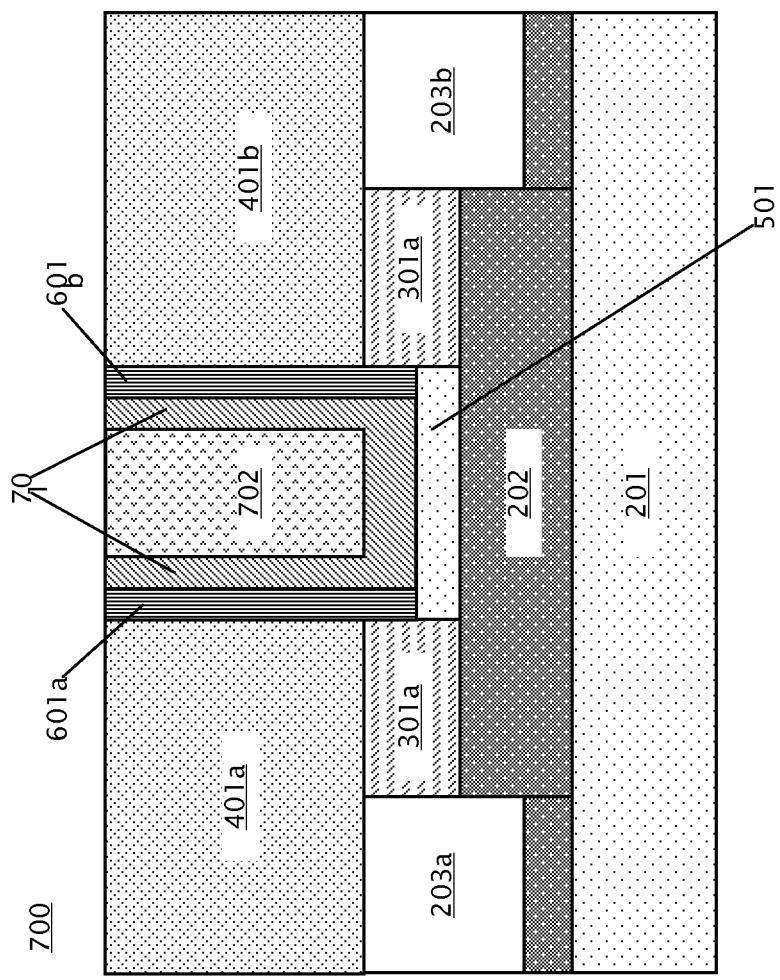
FIG. 7 illustrates an embodiment of the device of FIG. 6 after formation of a gate dielectric and gate metal layer in the gate opening.

In block 106, a gate stack, including a gate dielectric layer 701 and gate metal 702, is formed in gate opening 402, resulting in a FET 700 with a thinned channel region 501 as shown in FIG. 7. Gate dielectric layer 701 is formed over spacer 601a-b and thinned channel region 501, and may include a high k dielectric material in some embodiments. Gate metal 702 acts as an electrical contact for the gate, and is formed over gate dielectric layer 701. FET 700 includes a relatively thin channel region 501, from about 0 nm to about 7 nm thick in some embodiments, and relatively thick source and drain regions 301a-b, from about 10 nm thick to about 20 nm thick in some embodiments.

The technical effects and benefits of exemplary embodiments include fabrication of a scaled FET with a relatively thin channel region and relatively thick source and drain regions, allowing for good control of the channel region.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for forming a field effect transistor (FET), the method comprising:
    forming a dummy gate on a top semiconductor layer of a semiconductor on insulator substrate;
    forming source and drain regions in the top semiconductor layer, wherein the source and drain regions comprise silicide and are located in the top semiconductor layer on either side of the dummy gate;
    forming a supporting material over the source and drain regions adjacent to the dummy gate;
    removing the dummy gate to form a gate opening, wherein a channel region of the top semiconductor layer exposed through the gate opening;
    thinning the channel region of the top semiconductor layer through the gate opening, wherein the silicide of the source and drain regions are exposed above the channel region by the thinning of the channel region; and
    forming gate spacers on the supporting material over the thinned channel region, wherein the gate spacers are in direct contact with the silicide of the source and drain regions above the thinned channel region; and forming a gate in the gate opening over the gate spacers and the thinned channel region.

2. The method of claim 1, wherein the semiconductor on insulator substrate comprises an insulator layer underneath the top semiconductor layer, and a bottom semiconductor layer under the insulator layer.

3. The method of claim 2, wherein the top semiconductor layer and the bottom semiconductor layer comprise silicon, and the insulator layer comprises buried oxide.

4. The method of claim 1, wherein the supporting material comprises oxide.

5. The method of claim 1, wherein forming the supporting material comprises:

depositing the supporting material over the dummy gate and source and drain regions; and chemical mechanical polishing a top surface of the deposited supporting material to expose a top surface of the dummy gate.

6. The method of claim 1, wherein thinning the channel region comprises sequential ozone modified Huang cleaning.

7. The method of claim 1, wherein the dummy gate comprises nitride, and wherein the nitride that comprises the dummy gate is removed during the removal of the dummy gate.

8. The method of claim 1, wherein forming the gate spacers:

depositing a spacer material on the sides of the supporting material in the gate opening; and etching the spacer material to form the gate spacers, wherein the gate spacers are in direct contact with the supporting material, and wherein a portion of the thinned channel region is exposed after formation of the gate spacers.

9. The method of claim 8, wherein the spacer material comprises nitride, wherein etching the spacer material comprises reactive ion etching, and the wherein the gate dielectric layer comprises a high k dielectric material.

10. The method of claim 8, wherein forming the gate comprises:

forming a gate dielectric layer in the gate opening over the gate spacers and the channel region, wherein the gate dielectric layer covers the exposed portion of the thinned channel region and the gate spacers; and forming a gate metal layer in the gate opening over the gate dielectric layer, wherein the gate dielectric layer is located between the gate metal layer and the gate spacers, and the gate metal layer is not in contact with the gate spacers.

11. The method of claim 1, wherein the thinned channel region is from about 0 nanometers thick to about 7 nanometers thick.

12. The method of claim 1, wherein the source and drain regions are from about 10 nanometers thick to about 20 nanometers thick.

13. The method of claim 1, wherein the thinned channel region is from about 0 nanometers thick to about 7 nanometers thick.

14. The method of claim 1, wherein the source and drain regions are from about 10 nanometers thick to about 20 nanometers thick.

15. The method of claim 1, wherein the dummy gate comprises silicon germanium, and wherein the silicon germanium that comprises the dummy gate is removed during the removal of the dummy gate.

* * * * *